United States Patent
Yamazaki

(10) Patent No.: US 9,660,096 B2
(45) Date of Patent: May 23, 2017

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/535,407

(22) Filed: Nov. 7, 2014

(65) Prior Publication Data

US 2015/0060852 A1 Mar. 5, 2015

Related U.S. Application Data

(63) Continuation of application No. 13/074,623, filed on Mar. 29, 2011, now Pat. No. 8,884,282.

(30) Foreign Application Priority Data

Apr. 2, 2010 (JP) .................. 2010-086449

(51) Int. Cl.
*H01L 29/10* (2006.01)
*H01L 29/786* (2006.01)
(Continued)

(52) U.S. Cl.
CPC ...... *H01L 29/7869* (2013.01); *H01L 27/1225* (2013.01); *H01L 29/517* (2013.01)

(58) Field of Classification Search
CPC ....................................... H01L 29/10
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transistion: The "Blue Phase"", Physics Letters, Sep. 10, 1973, vol. 45A, No. 2, pp. 115-116.
(Continued)

*Primary Examiner* — Marvin Payen
(74) *Attorney, Agent, or Firm* — Fish & Richardson P.C.

(57) ABSTRACT

A transistor is provided in which the bottom surface portion of an oxide semiconductor film is provided with a metal oxide film containing a constituent similar to that of the oxide semiconductor film, and an insulating film containing a different constituent from the metal oxide film and the oxide semiconductor film is formed in contact with a surface of the metal oxide film, which is opposite to the surface in contact with the oxide semiconductor film. In addition, the oxide semiconductor film used for the active layer of the transistor is an oxide semiconductor film highly purified to be electrically i-type (intrinsic) through heat treatment in which impurities such as hydrogen, moisture, hydroxyl, and hydride are removed from the oxide semiconductor and oxygen which is one of main component materials of the oxide semiconductor is supplied and is also reduced in a step of removing impurities.

33 Claims, 10 Drawing Sheets

(51) Int. Cl.
*H01L 27/12* (2006.01)
*H01L 29/51* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,129,719 B2 | 3/2012 | Yamazaki et al. |
| 8,148,779 B2 | 4/2012 | Jeong et al. |
| 8,188,480 B2 | 5/2012 | Itai |
| 8,203,143 B2 | 6/2012 | Imai |
| 8,461,584 B2 | 6/2013 | Yamazaki |
| 8,502,221 B2 | 8/2013 | Yamazaki |
| 8,551,810 B2 | 10/2013 | Yamazaki |
| 8,653,514 B2 | 2/2014 | Yamazaki |
| 8,659,013 B2 | 2/2014 | Yamazaki |
| 8,704,219 B2 | 4/2014 | Yamazaki et al. |
| 9,012,908 B2 | 4/2015 | Yamazaki |
| 9,059,047 B2 | 6/2015 | Yamazaki |
| 9,059,295 B2 | 6/2015 | Yamazaki |
| 9,064,898 B2 | 6/2015 | Yamazaki |
| 9,076,877 B2 | 7/2015 | Yamazaki |
| 9,147,768 B2 | 9/2015 | Yamazaki |
| 9,190,522 B2 | 11/2015 | Yamazaki |
| 9,196,739 B2 | 11/2015 | Yamazaki |
| 9,318,613 B2 | 4/2016 | Yamazaki |
| 9,406,786 B2 | 8/2016 | Yamazaki |
| 9,425,295 B2 | 8/2016 | Yamazaki |
| 9,431,429 B2 | 8/2016 | Yamazaki |
| 9,496,416 B2 | 11/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0044714 A1 | 3/2007 | White |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308806 A1 | 12/2008 | Akimoto et al. |
| 2009/0032096 A1 | 2/2009 | Tanaka et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236655 A1 | 9/2009 | Choi et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1* | 12/2009 | Kim ............... H01L 29/7869 257/43 |
| 2009/0325363 A1* | 12/2009 | Ohnuma ........... H01L 21/76254 438/458 |
| 2010/0032668 A1 | 2/2010 | Yamazaki et al. |
| 2010/0051937 A1 | 3/2010 | Kaji et al. |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0176383 A1* | 7/2010 | Park ............... H01L 27/3262 257/40 |
| 2010/0200843 A1 | 8/2010 | Arai et al. |
| 2011/0193083 A1 | 8/2011 | Kim et al. |
| 2011/0233541 A1 | 9/2011 | Yamazaki |
| 2012/0119205 A1 | 5/2012 | Taniguchi et al. |
| 2015/0311347 A1 | 10/2015 | Yamazaki |
| 2016/0225908 A1 | 8/2016 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |

(56) References Cited

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-073701 A | 3/2007 |
| JP | 2007-096126 A | 4/2007 |
| JP | 2008-218495 A | 9/2008 |
| JP | 2009-033004 A | 2/2009 |
| JP | 2009-231613 A | 10/2009 |
| JP | 2010-016347 A | 1/2010 |
| JP | 2010-016348 A | 1/2010 |
| JP | 2010-067954 A | 3/2010 |
| JP | 2010-073881 A | 4/2010 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu, or Zn] at Temperatures Over 1000°C, Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg—Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID Internatinoal Symposium Digest of Technical Papers, May 20, 2008, vol. 39, No. 1, pp. 1-4.

Lee.J et al., "World's Largest (15-Inch) XGA AMLCD Panel Using Igzo Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film its Bending Properties", SID Digest '09 : SID International Symposium Digest of Technical Papers, May 31, 2009, pp. 983-985.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B) Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) ,2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol—Gel—Derived Zinc Oxide Films by Irradiation With Ultraviolet Lamp", Journal of Sol—Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vaccum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

* cited by examiner

SEMICONDUCTOR DEVICE

CROSS-REFERENCE TO RELATED APPLICATIONS

This application is a continuation of U.S. application Ser. No. 13/074,623, filed Mar. 29, 2011, now allowed, which claims the benefit of a foreign priority application filed in Japan as Serial No. 2010-086449 on Apr. 2, 2010, both of which are incorporated by reference.

BACKGROUND OF THE INVENTION

1. Field of the Invention

The present invention relates to a semiconductor device and a manufacturing method thereof.

In this specification, a semiconductor device means a general device which can function by utilizing semiconductor characteristics, and an electro-optic device, a semiconductor circuit, and an electronic device are all semiconductor devices.

2. Description of the Related Art

A technique by which transistors are formed using semiconductor thin films formed over a substrate having an insulating surface has been attracting attention. Such transistors are applied to a wide range of electronic devices such as an integrated circuit (IC) or an image display device (display device). As semiconductor thin films applicable to the transistors, silicon-based semiconductor materials have been widely used, but oxide semiconductors have been attracting attention as alternative materials.

For example, disclosed is a transistor whose active layer is formed using an amorphous oxide containing indium (In), gallium (Ga), and zinc (Zn) and having an electron carrier concentration of less than $10^{18}/cm^3$ (see Patent Document 1).

A transistor including an oxide semiconductor is known to have a problem of low reliability because of high possibility of change in electric characteristics, although the transistor including an oxide semiconductor can operate at higher speed than a transistor including amorphous silicon and can be manufactured more easily than a transistor including polycrystalline silicon. For example, the threshold voltage of the transistor fluctuates after a BT test performed under light. On the other hand, Patent Documents 2 and 3 each disclose a technique of preventing charge trapping at the interface of an oxide semiconductor layer with the use of an interfacial stability layer, which is provided on at least one of the top surface and the bottom surface of the oxide semiconductor layer, in order to suppress the shift of the threshold voltage of the transistor including an oxide semiconductor.

REFERENCE

[Patent Document 1] Japanese Published Patent Application No. 2006-165528
[Patent Document 2] Japanese Published Patent Application No. 2010-16347
[Patent Document 3] Japanese Published Patent Application No. 2010-16348

SUMMARY OF THE INVENTION

The transistor disclosed in Patent Document 2 or 3, however, includes as the interfacial stability layer a layer having the same characteristics as those of a gate insulating layer and a protective layer, so that the state of the interface with an active layer cannot be kept favorably. This is why it is difficult to suppress charge trapping at the interface between the active layer and the interfacial stability layer. In particular, in the case where the interfacial stability layer and the active layer have equivalent band gaps, charge is likely to be stored.

Thus, a transistor including an oxide semiconductor cannot yet be said to have sufficiently high reliability.

In view of the above problems, an object is to stabilize electric characteristics of a semiconductor device including an oxide semiconductor to increase reliability.

One embodiment of the invention disclosed herein is based on the following technical idea: a metal oxide film is provided in contact with an oxide semiconductor film on the side opposite to a gate electrode of the oxide semiconductor film (a back channel side) and the metal oxide film contains a constituent similar to that of the oxide semiconductor film. In other words, one embodiment of the invention disclosed herein includes a stacked-layer structure of an oxide semiconductor film, a metal oxide film, and an insulating film containing a different constituent from the oxide semiconductor film and the metal oxide film. Here, containing "a constituent similar to that of the oxide semiconductor film" means containing one or more of metal elements selected from constituent elements of the oxide semiconductor film.

Such a stacked-layer structure makes it possible to sufficiently suppress trapping of charge or the like, which can be generated due to the operation of a semiconductor device, or the like, at the interface of the insulating film and the oxide semiconductor film. This advantageous effect is brought by the following mechanism: the metal oxide film containing a material compatible with the oxide semiconductor film is provided in contact with the oxide semiconductor film, which suppresses trapping of charge or the like which can be generated due to the operation of a semiconductor device at the interface between the oxide semiconductor film and the metal oxide film. Meanwhile, the insulating film containing a material with which a charge trapping center can be formed at the interface is provided in contact with the metal oxide film, whereby the charge can be trapped at the interface between the metal oxide film and the insulating film.

That is to say, in the case where a large amount of charge is generated, it is difficult to suppress trapping of charge at the interface between the oxide semiconductor film and the metal oxide film, only with the metal oxide film; however, when the insulating film is provided in contact with the metal oxide film, charge is trapped preferentially at the interface between the metal oxide film and the insulating film, so that trapping of charge at the interface between the oxide semiconductor film and the metal oxide film can be suppressed. Thus, it can be said that the advantageous effect of one embodiment of the invention disclosed herein is attributed to the stacked-layer structure of the oxide semiconductor film, the metal oxide film, and the insulating film and is different from an effect due to a stacked-layer structure of an oxide semiconductor film and a metal oxide film.

Since trapping of charge at the interface of the oxide semiconductor film can be suppressed and a charge trapping center can be kept away from the oxide semiconductor film, operation malfunctions of the semiconductor device can be reduced to increase reliability of the semiconductor device.

In the above mechanism, the metal oxide film preferably has an enough thickness. This is because the influence of charge trapped at the interface between the metal oxide film and the insulating film may be great when the metal oxide film is thin. For example, the metal oxide film is preferably thicker than the oxide semiconductor film.

The metal oxide film having an insulating property is formed so as not to hinder connection between the oxide semiconductor film and source and drain electrodes, so that an increase in resistance can be prevented as compared to the case where a metal oxide film is provided between an oxide semiconductor film and a source electrode or a drain electrode. Thus, it is possible to suppress deterioration of electric characteristics of the transistor.

When the composition of an oxide semiconductor differs from the stoichiometric composition because of an excess or a deficiency of oxygen, or hydrogen or moisture which serves as an electron donor enters the oxide semiconductor in a thin film formation process, the conductivity of the oxide semiconductor is changed. Such a phenomenon is a factor of a change in electric characteristics of the transistor including an oxide semiconductor. Therefore, an oxide semiconductor film is highly purified to be electrically i-type (intrinsic) through heat treatment in which impurities such as hydrogen, moisture, hydroxyl, and hydride (also referred to as a hydrogen compound) are removed from the oxide semiconductor and oxygen which is one of main component materials of the oxide semiconductor is supplied and is also reduced in a step of removing impurities.

An i-type (intrinsic) oxide semiconductor is an oxide semiconductor highly purified to be i-type (intrinsic) or substantially i-type (intrinsic) by removing hydrogen, which is an n-type impurity, from the oxide semiconductor so that impurities that are not main components of the oxide semiconductor are contained as little as possible.

Note that in the process of making an oxide semiconductor film intrinsic, a metal oxide film containing a constituent similar to that of the oxide semiconductor film may also be made intrinsic at the same time. According to one embodiment of the invention disclosed herein, a metal oxide film provided in contact with an oxide semiconductor film is preferably made electrically intrinsic by sufficiently reducing impurities such as moisture and hydrogen.

The electric characteristics of a transistor including a highly purified oxide semiconductor film, such as the threshold voltage and an off-state current, have almost no temperature dependence. Further, transistor characteristics are less likely to change due to light deterioration.

One embodiment of the present invention will be specifically described below.

According to one embodiment of the present invention, a semiconductor device includes a first insulating film; a metal oxide film in contact with the first insulating film over the first insulating film; an oxide semiconductor film in contact with the metal oxide film; a source electrode and a drain electrode in contact with the oxide semiconductor film; a gate insulating film in contact with the oxide semiconductor film, the source electrode, and the drain electrode; and a gate electrode formed over the gate insulating film.

According to another embodiment of the present invention, a semiconductor device includes a first insulating film; a metal oxide film in contact with the first insulating film over the first insulating film; a source electrode and a drain electrode formed over the metal oxide film; an oxide semiconductor film in contact with the metal oxide film, the source electrode, and the drain electrode; a gate insulating film in contact with the oxide semiconductor film, the source electrode, and the drain electrode; and a gate electrode formed over the gate insulating film.

In the above semiconductor device, the metal oxide film preferably includes oxide of one or a plurality of metal elements selected from constituent elements of the oxide semiconductor film.

In addition, in the above semiconductor device, the energy gap of the metal oxide film is preferably larger than the energy gap of the oxide semiconductor film. Energy at the bottom of a conduction band of the metal oxide film is preferably higher than energy at the bottom of a conduction band of the oxide semiconductor film.

In the above semiconductor device, the metal oxide film preferably includes gallium oxide, the first insulating film preferably includes silicon oxide, and the gate insulating film preferably includes silicon oxide or hafnium oxide.

In the above semiconductor device, side edges of the oxide semiconductor film in a channel length direction can be aligned with side edges of the metal oxide film in a channel length direction.

In the above, the channel length L of the transistor, which depends on the distance between the source electrode and the drain electrode, can be longer than or equal to 10 nm and shorter than or equal to 10 μm, for example, 0.1 μm to 0.5 μm. It is needless to say that the channel length L may be longer than or equal to 1 μm. The channel width W can be longer than or equal to 10 nm.

According to one embodiment of the present invention, a transistor having stable electric characteristics is provided.

According to one embodiment of the present invention, a semiconductor device including a highly reliable transistor having favorable electric characteristics is provided.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, one embodiment of a semiconductor device and a manufacturing method thereof will be described with reference to FIGS. 1A to 1C, FIG. 2, FIGS. 3A to 3D, FIGS. 4A to 4D, and FIGS. 5A to 5D.

<Structural Example of Semiconductor Device>

Figure 1A:
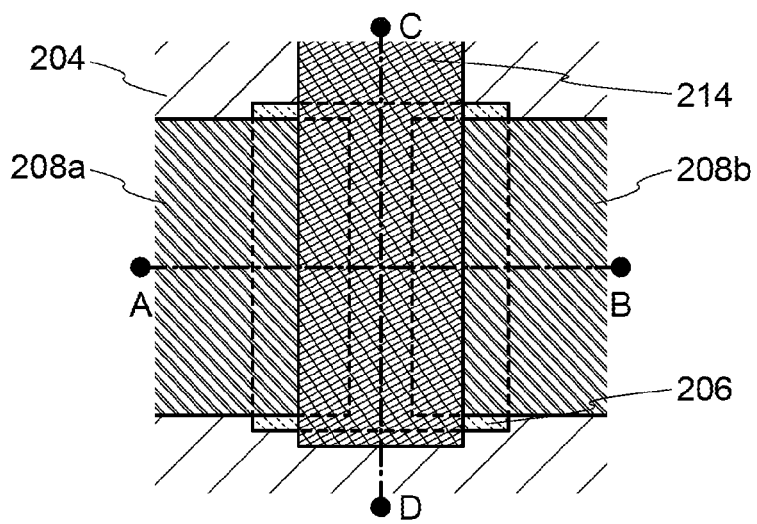
FIG. 1A is a plan view and FIGS. 1B and 1C are cross-sectional views according to one embodiment of a semiconductor device.
Figure 1B:
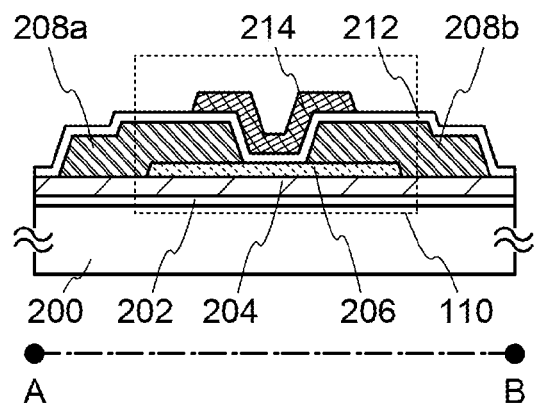
Figure 1C:
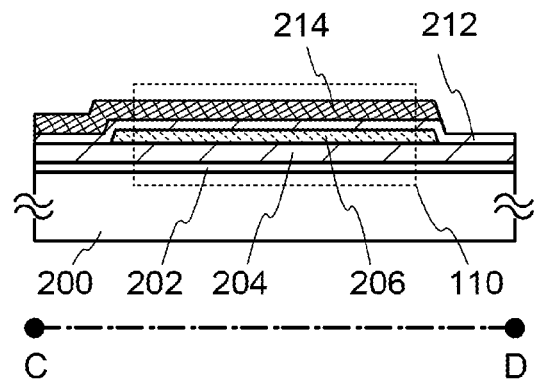

FIGS. 1A to 1C are a plan view and cross-sectional views of a transistor 110 as an example of a semiconductor device according to one embodiment of the invention disclosed herein. Here, FIG. 1A is a plan view, FIG. 1B is a cross-sectional view along line A-B of FIG. 1A, and FIG. 1C is a cross-sectional view along line C-D of FIG. 1A. Note that part of components of the transistor 110 (e.g., a gate insulating film 212) are omitted for brevity.

The transistor 110 in FIGS. 1A to 1C includes, over a substrate 200, an insulating film 202, a metal oxide film 204, an oxide semiconductor film 206, a source electrode 208a, a drain electrode 208b, the gate insulating film 212, and a gate electrode 214. In the transistor in FIGS. 1A to 1C, the oxide semiconductor film 206 is provided over and in contact with the metal oxide film 204.

Here, it is preferable to use oxide containing a constituent similar to that of the oxide semiconductor film 206 for the metal oxide film 204. Specifically, the metal oxide film 204 is a film containing oxide of one or more of metal elements selected from constituent elements of the oxide semiconductor film. Such a material is compatible with the oxide semiconductor film 206; thus, when it is used for the metal oxide film 204, the state of the interface between the oxide semiconductor film and the metal oxide film 204 can be kept favorably. That is to say, the use of the above material for the metal oxide film 204 makes it possible to suppress trapping of charge at the interface between the oxide semiconductor film and the metal oxide film in contact with the oxide semiconductor film (here, the interface between the metal oxide film 204 and the oxide semiconductor film 206).

The metal oxide film 204 needs to have a larger energy gap than the oxide semiconductor film 206 because the oxide semiconductor film 206 is used as an active layer. In addition, it is necessary to form at least an energy barrier between the metal oxide film 204 and the oxide semiconductor film 206, in which carriers do not flow from the oxide semiconductor film 206 at room temperature (20° C.). For example, the energy difference between the bottom of the conduction band of the oxide semiconductor film 206 and the bottom of the conduction band of the metal oxide film 204 or the energy difference between the top of the valence band of the oxide semiconductor film 206 and the top of the valence band of the metal oxide film 204 is preferably 0.5 eV or more, more preferably 0.7 eV or more. In addition, the energy difference therebetween is preferably 1.5 eV or less.

Specifically, for example, in the case where an In—Ga—Zn—O-based material is used for the oxide semiconductor film 206, the metal oxide film 204 may be formed using a material containing gallium oxide, or the like. In the case where the gallium oxide is in contact with the In—Ga—Zn—O-based material, the energy barrier is about 0.8 eV on the conduction band side and about 0.95 eV on the valence band side.

Note that gallium oxide is also referred to as $GaO_x$ and the value of x is preferably set so that the oxygen amount exceeds the stoichiometric proportion. For example, the value of x is preferably set to larger than or equal to 1.4 and smaller than or equal to 2.0, more preferably larger than or equal to 1.5 and smaller than or equal to 1.8. When gallium oxide is used as the metal oxide film, it is preferable that a gallium oxide film is a film from which impurities such as hydrogen and water are sufficiently reduced. Note that a gallium oxide film may contain an impurity element other than hydrogen, for example, an element belonging to Group 3 such as yttrium, an element belonging to Group 4 such as hafnium, an element belonging to Group 13 such as aluminum, an element belonging to Group 14 such as silicon, or nitrogen so that the energy gap of the gallium oxide is increased to improve the insulating property. The energy gap of a gallium oxide film which does not contain an impurity is 4.9 eV; however, when the gallium oxide film contains any of the above impurities at about greater than 0 atomic % and less than or equal to 20 atomic %, the energy gap can be increased to about 6 eV.

Considering that charge sources and charge trapping centers should be reduced, it is preferable to sufficiently reduce impurities such as hydrogen and water in the metal oxide film. This idea is similar to the idea of reduction of impurities in an oxide semiconductor film.

It is preferable to use, for the insulating film 202, a material with which a charge trapping center can be formed at the interface with the metal oxide film 204 when the material is in contact with the metal oxide film 204. By using such a material for the insulating film 202, charge is trapped at the interface between the insulating film 202 and the metal oxide film 204, so that it is possible to sufficiently suppress trapping of charge at the interface between the metal oxide film 204 and the oxide semiconductor film 206.

Specifically, the insulating film 202 and the gate insulating film 212 may be formed using silicon oxide, silicon nitride, aluminum oxide, aluminum nitride, a mixed material of any of them, or the like. For example, in the case where a material containing gallium oxide is used for the metal oxide film 204, silicon oxide, silicon nitride, or the like is preferably used for the insulating film 202 and the gate insulating film 212. In addition, the energy gaps of the insulating film 202 and the gate insulating film 212 are preferably larger than that of the metal oxide film 204 because the insulating film 202 and the gate insulating film 212 are in contact with the metal oxide film 204.

Note that it is not necessary to limit the material of each of the insulating film 202 and the gate insulating film 212 to the above as long as a charge trapping center can be formed at the interface between the insulating film 202 and the metal oxide film 204. Further, treatment through which a charge trapping center is formed may be performed on the interface between the insulating film 202 and the metal oxide film 204. As such treatment, plasma treatment and treatment for adding an element (ion implantation or the like) are given, for example.

A second insulating film may further be formed over the transistor 110. Further, openings may be formed in the insulating film 202, the metal oxide film 204, the gate insulating film 212, and the like in order that the source electrode 208a and the drain electrode 208b may be electrically connected to a wiring. A second gate electrode may further be provided below the oxide semiconductor film 206. Note that it is not always necessary but preferable to process the oxide semiconductor film 206 into an island shape.

Figure 2:
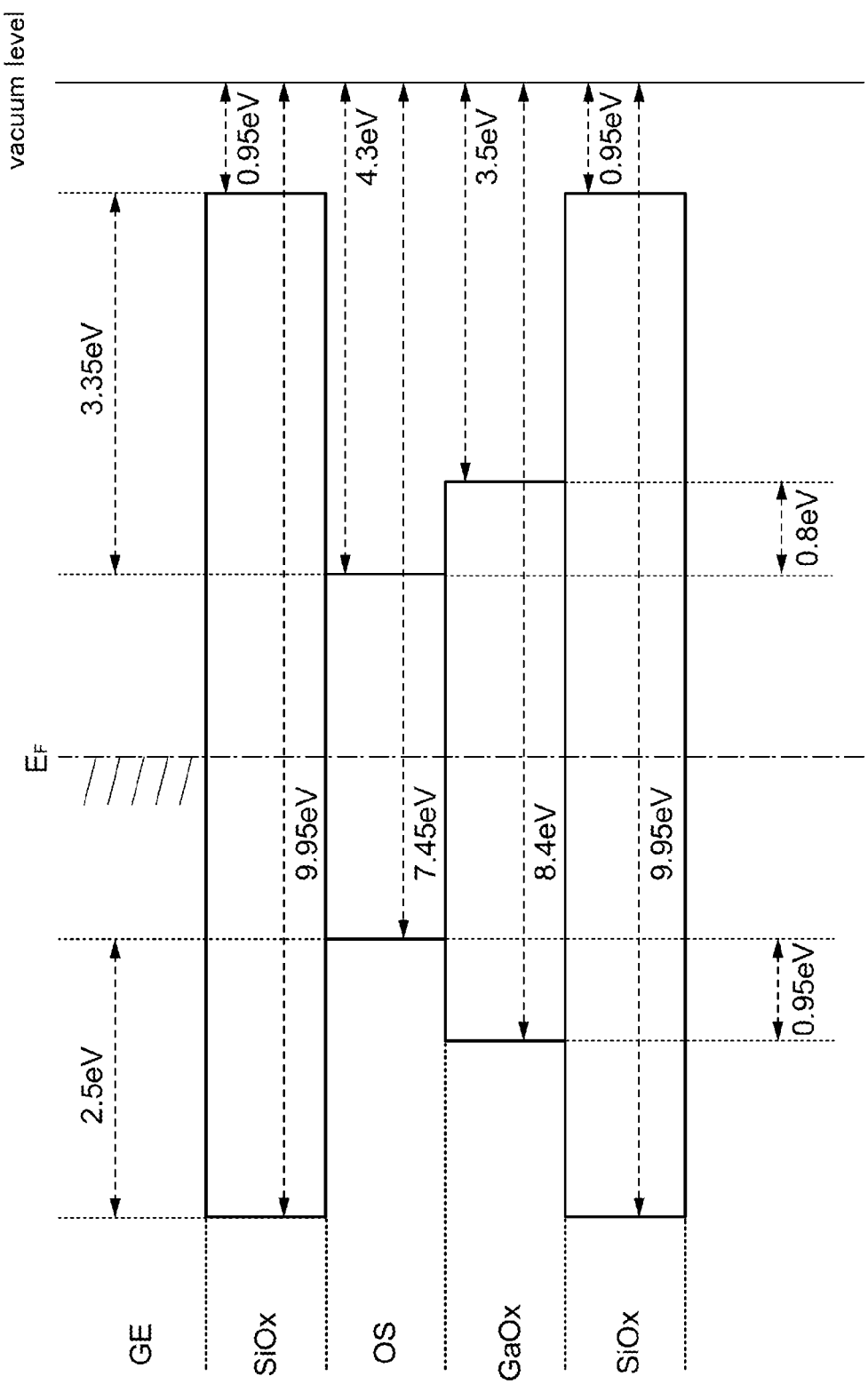
FIG. 2 is a band diagram of a transistor including an oxide semiconductor film and a metal oxide film.

FIG. 2 is an energy band diagram (schematic diagram) of the transistor 110, that is, an energy band diagram of the structure where the insulating film, the oxide semiconductor film, the metal oxide film, and the insulating film are bonded to each other from the gate electrode side. FIG. 2 shows the case where silicon oxide (with a band gap Eg of 8 eV to 9 eV), gallium oxide (with a band gap Eg of 4.9 eV), and an In—Ga—Zn—O-based non-single-crystal film (with a band gap Eg of 3.15 eV) are used as the insulating film, the metal oxide film, and the oxide semiconductor film, respectively, on the assumption of the ideal state where the insulating films, the metal oxide film, and the oxide semiconductor film are all intrinsic. Note that the energy difference between the vacuum level and the bottom of the conduction band of the silicon oxide is 0.95 eV, the energy difference between the vacuum level and the bottom of the conduction band of the gallium oxide is 3.5 eV, and the energy difference between the vacuum level and the bottom of the conduction band of the In—Ga—Zn—O-based non-single-crystal film is 4.3 eV.

As shown in FIG. 2, on the gate electrode side (the channel side) of the oxide semiconductor film, energy barriers of about 3.35 eV and about 2.5 eV exist at the interface between the oxide semiconductor film and the insulating film. On the side opposite to the gate electrode (the back channel side) of the oxide semiconductor film, similarly, energy barriers of about 0.8 eV and about 0.95 eV exist at the interface between the oxide semiconductor film and the metal oxide film. When such energy barriers exist at the interface between the oxide semiconductor film and the insulating film and the interface between the oxide semiconductor film and the metal oxide film, transport of carriers at the interface between the oxide semiconductor film and the insulating film and the interface between the oxide semiconductor film and the metal oxide film can be prevented; thus, the carriers transport in the oxide semiconductor film and do not transport from the oxide semiconductor film to the insulating film or from the oxide semiconductor film to the metal oxide film. In other words, the oxide semiconductor film is provided so as to be sandwiched between materials whose band gaps are each larger than the band gap of the oxide semiconductor film (here, the metal oxide film and the insulating films), whereby the carriers transport in the oxide semiconductor film.

FIGS. 3A to 3D illustrate cross-sectional structures of transistors having different structures from that of the transistor 110. In FIGS. 3A to 3D, top-gate transistors are illustrated as transistors according to one embodiment of the invention disclosed herein.

Figure 3A:
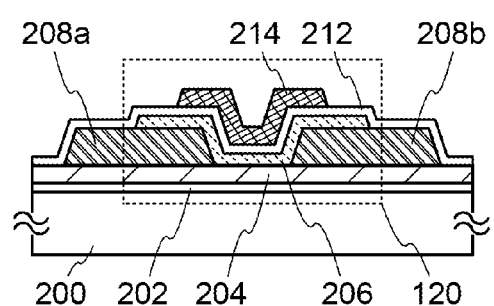
FIGS. 3A to 3D are cross-sectional views according to one embodiment of a semiconductor device.

A transistor 120 in FIG. 3A is the same as the transistor 110 in that it includes, over the substrate 200, the insulating film 202, the metal oxide film 204, the oxide semiconductor film 206, the source electrode 208a, the drain electrode 208b, the gate insulating film 212, and the gate electrode 214. The differences between the transistor 120 and the transistor 110 are the positions where the oxide semiconductor film 206 is connected to the source electrode 208a and the drain electrode 208b. That is, the source electrode 208a and the drain electrode 208b are in contact with bottom portions of the oxide semiconductor film 206 in the transistor 120. The other components are the same as those of the transistor 110 in FIGS. 1A to 1C; thus, the description on FIGS. 1A to 1C can be referred to for the details.

Figure 3B:
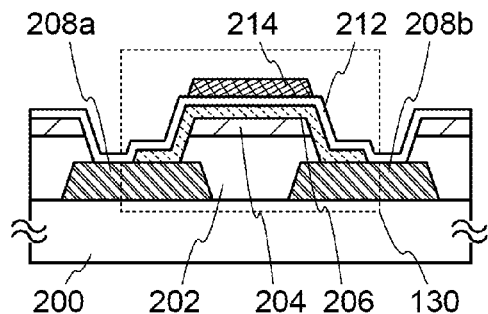

A transistor 130 in FIG. 3B is the same as the transistor 120 in FIG. 3A in that it includes the above components. The differences between the transistor 130 and the transistor 120 are the convex shape of the insulating film 202, the positions where the source electrode 208a and the drain electrode 208b are formed, and the island shape of the metal oxide film 204, for example. The other components are the same as those in FIG. 3A.

Figure 3C:
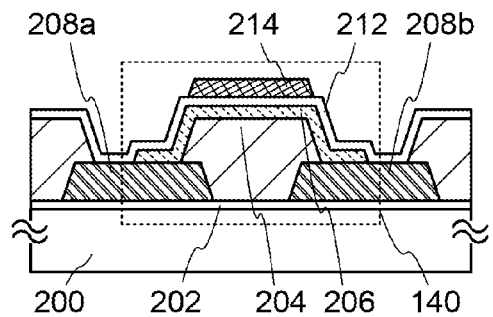

A transistor 140 in FIG. 3C is the same as the transistor 130 in FIG. 3B in that it includes the above components. The transistor 140 is different from the transistor 130 in that the insulating film 202 is flat, and the metal oxide film 204 has a convex shape. Note that the insulating film 202 is not necessarily provided when the substrate 200 has a function of the insulating film 202. The other components are the same as those in FIG. 3B.

Figure 3D:
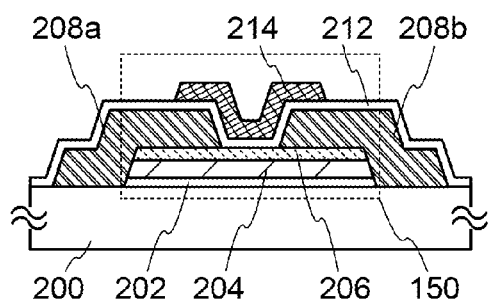

A transistor 150 in FIG. 3D is the same as the transistor 110 in FIGS. 1A to 1C, the transistor 120 in FIG. 3A, the transistor 130 in FIG. 3B, and the transistor 140 in FIG. 3C, respectively, in that they include the above components. The transistor 150 in FIG. 3D is different from the transistor 110 in FIGS. 1A to 1C, the transistor 120 in FIG. 3A, the transistor 130 in FIG. 3B, and the transistor 140 in FIG. 3C in that the insulating film 202 and the metal oxide film 204 are processed to have an island shape. The other components are the same as those in FIGS. 1A to 1C, FIG. 3A, FIG. 3B, or FIG. 3C.

<Example of Manufacturing Process of Transistor>

Examples of a manufacturing process of the transistor in FIGS. 1A to 1C and a manufacturing process of the transistor in FIG. 3A will be described below with reference to FIGS. 4A to 4D and FIGS. 5A to 5D.

<Manufacturing Process of Transistor 110>

An example of a manufacturing process of the transistor 110 in FIGS. 1A to 1C will be described with reference to FIGS. 4A to 4D. A manufacturing process of the transistor 150 in FIG. 3D is the same as that of the transistor 110 except that the metal oxide film 204 and the like are processed in accordance with the shape of the oxide semiconductor film 206.

Figure 4A:
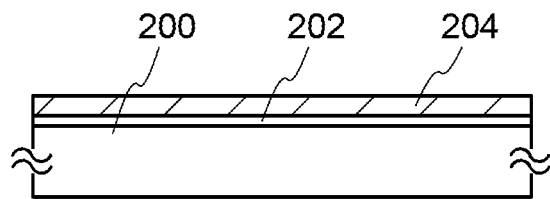
FIGS. 4A to 4D are cross-sectional views of an example of a manufacturing process of a semiconductor device.

First, the insulating film 202 is formed over the substrate 200, and then, the metal oxide film 204 is formed over and in contact with the insulating film 202 (see FIG. 4A).

There is no particular limitation on the property of a material and the like of the substrate 200 as long as the material has heat resistance enough to withstand at least heat treatment to be performed later. For example, a substrate such as a glass substrate, a ceramic substrate, a quartz substrate, or a sapphire substrate can be used as the substrate 200. Alternatively, a single crystal semiconductor substrate or a polycrystalline semiconductor substrate of silicon, carbon silicon, or the like; a compound semiconductor substrate of silicon germanium or the like; an SOI substrate; or the like can be used. Still alternatively, any of these substrates further provided with a semiconductor element may be used as the substrate 200.

A flexible substrate may be used as the substrate 200. In the case where a transistor is provided over the flexible substrate, the transistor may be directly formed on the flexible substrate. Alternatively, the transistor may be formed over a different substrate and then separated to be transferred to the flexible substrate. Note that in order to separate the transistor from the substrate and transfer it to the flexible substrate, a separation layer is preferably formed between the different substrate and the transistor.

It is preferable to use, for the insulating film 202, a material with which a charge trapping center can be formed at the interface with the metal oxide film 204 when the material is in contact with the metal oxide film 204. By using such a material for the insulating film 202, charge is trapped at the interface between the insulating film 202 and the metal oxide film 204, so that it is possible to sufficiently suppress trapping of charge at the interface between the metal oxide film 204 and the oxide semiconductor film 206.

Specifically, the insulating film 202 may be formed using silicon oxide, silicon nitride, aluminum oxide, aluminum nitride, a mixed material of any of them, or the like. For example, in the case where a material containing gallium oxide is used for the metal oxide film 204, silicon oxide, silicon nitride, or the like is preferably used for the insulating film 202. In addition, the energy gap of the insulating film 202 is preferably larger than that of the metal oxide film 204 because the insulating film 202 is in contact with the metal oxide film 204.

Note that it is not necessary to limit the material of the insulating film 202 to the above as long as a charge trapping center can be formed at the interface between the insulating film 202 and the metal oxide film 204. Further, treatment through which a charge trapping center is formed may be performed on the interface between the insulating film 202 and the metal oxide film 204. As such treatment, plasma treatment and treatment for adding an element (ion implantation or the like) are given, for example.

There is no particular limitation on the method for forming the insulating film 202, and for example, the insulating film 202 may be formed by a film formation method such as a plasma CVD method or a sputtering method. The insulating film 202 may have a single-layer structure or a stacked-layer structure using an insulating film including any of the above materials.

In the case where a substrate including any of the above insulating materials is used as the substrate 200, the substrate 200 can be handled as the insulating film 202. In other words, the insulating film 202 mentioned here may be omitted. In that case, it is more preferable to use silicon oxide or the like for the substrate 200.

It is preferable to use oxide containing a constituent similar to that of the oxide semiconductor film 206 for the metal oxide film 204. This is because such a material is compatible with the oxide semiconductor film 206 and thus, when it is used for the metal oxide film 204, the state of the interface with the oxide semiconductor film can be kept favorably. That is to say, the use of the above material for the metal oxide film 204 makes it possible to suppress trapping of charge at the interface between the oxide semiconductor film and the metal oxide film in contact with the oxide semiconductor film (here, the interface between the metal oxide film 204 and the oxide semiconductor film 206).

The metal oxide film 204 needs to have a larger energy gap than the oxide semiconductor film 206 because the oxide semiconductor film 206 is used as an active layer. In addition, it is necessary to form at least an energy barrier between the metal oxide film 204 and the oxide semiconductor film 206, in which carriers do not flow from the oxide semiconductor film 206 at room temperature (20° C.). For example, the energy difference between the bottom of the conduction band of the oxide semiconductor film 206 and the bottom of the conduction band of the metal oxide film 204 or the energy difference between the top of the valence band of the oxide semiconductor film 206 and the top of the valence band of the metal oxide film 204 is preferably 0.5 eV or more, more preferably 0.7 eV or more. In addition, the energy difference therebetween is preferably 1.5 eV or less.

Considering that charge sources and charge trapping centers should be reduced, it is preferable to sufficiently reduce impurities such as hydrogen and water in the metal oxide film. This idea is similar to the idea of reduction of impurities in an oxide semiconductor film.

The metal oxide film 204 is preferably formed by using a method with which impurities such as water or hydrogen do not enter the metal oxide film 204. When hydrogen is contained in the metal oxide film 204, entry of the hydrogen to the oxide semiconductor film 206 or extraction of oxygen in the oxide semiconductor film 206 by the hydrogen is caused, whereby a backchannel of the oxide semiconductor film 206 comes to be n-type (to have a lower resistance); thus, a parasitic channel might be formed. Therefore, it is important that a film formation method in which hydrogen is not used is employed in order to form the metal oxide film 204 containing as little hydrogen as possible.

Thus, it is preferable to form the metal oxide film 204 by a sputtering method, and it is preferable that a high-purity gas in which impurities such as hydrogen, water, hydroxyl, or hydride are removed be used as the sputtering gas for the film formation.

Figure 4B:
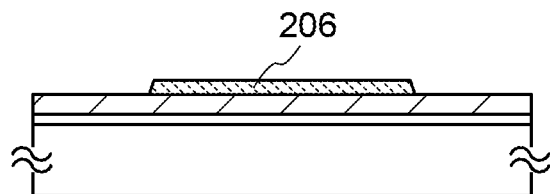

Next, an oxide semiconductor film is formed over the metal oxide film 204 and then is processed to form the oxide semiconductor film 206 having an island shape (see FIG. 4B).

The oxide semiconductor film is preferably formed by a method with which hydrogen, water, and the like do not easily enter the film, such as a sputtering method. The thickness of the oxide semiconductor film is preferably larger than or equal to 3 nm and smaller than or equal to 30 nm. This is because the transistor might possibly be normally on when the oxide semiconductor film is too thick (e.g., the thickness is 50 nm or more).

As a material used for the oxide semiconductor film, an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material which are two—component metal oxides; or an In—O-based material, a Sn—O-based material, or a Zn—O-based material which are one-component metal oxides can be used. Further, $SiO_2$ may be contained in the above material. Here, for example, an In—Ga—Zn—O-based material means an oxide semiconductor containing indium (In), gallium (Ga), and zinc (Zn), and there is no particular limitation on the composition ratio thereof. Further, the In—Ga—Zn—O-based material may contain an element other than In, Ga, and Zn, for example, $SiO_2$.

A thin film formed using a material expressed by the chemical formula of $InMO_3(ZnO)_m$ (m>0) may be used as the oxide semiconductor film. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, when a target used for forming the In—Zn—O-based oxide semiconductor has a composition ratio of In:Zn:O=X:Y:Z in an atomic ratio, Z>(1.5X+Y) is satisfied.

In this embodiment, the oxide semiconductor film is formed by a sputtering method with the use of an In—Ga—Zn—O-based metal oxide target.

As the target used when an In—Ga—Zn—O-based material is used as the oxide semiconductor, for example, a metal oxide target containing $In_2O_3$, $Ga_2O_3$, and ZnO in a composition ratio of 1:1:1 [molar ratio] can be used. Without limitation to the above material and component ratio of the target, for example, a metal oxide target containing $In_2O_3$, $Ga_2O_3$, and ZnO in a composition ratio of 1:1:2 [molar ratio] can also be used.

The fill rate of the metal oxide target is higher than or equal to 90% and lower than or equal to 100%, preferably higher than or equal to 95% and lower than or equal to 99.9%. With the use of the metal oxide target with high fill rate, a dense oxide semiconductor film can be formed.

The atmosphere for the film formation may be a rare gas (typically argon) atmosphere, an oxygen atmosphere, a mixed atmosphere of a rare gas and oxygen, or the like. Moreover, it is preferable to employ an atmosphere using a high-purity gas in which impurities such as hydrogen, water, hydroxyl, and hydride are sufficiently removed because entry of hydrogen, water, hydroxyl, and hydride into the oxide semiconductor film can be prevented.

For example, the oxide semiconductor film can be formed as follows.

First, the substrate 200 is held in a film formation chamber kept under reduced pressure, and the substrate temperature is set to a temperature of higher than or equal to 100° C. and lower than or equal to 600° C., preferably higher than or equal to 200° C. and lower than or equal to 400° C. By forming the oxide semiconductor film in a state where the substrate 200 is heated, the impurity concentration in the oxide semiconductor film can be reduced. In addition, damage by sputtering can be reduced.

Then, a high-purity gas from which impurities such as hydrogen and moisture are sufficiently removed is introduced while residual moisture in the film formation chamber is removed, and the oxide semiconductor film is formed over the substrate 200 using the above target. In order to remove the residual moisture in the film formation chamber, an entrapment vacuum pump, for example, a cryopump, an ion pump, or a titanium sublimation pump is preferably used as an exhaustion unit. The exhaustion unit may be a turbo molecular pump provided with a cold trap. In the film formation chamber which is exhausted with the cryopump, for example, a hydrogen molecule, a compound containing a hydrogen atom, such as water ($H_2O$), (more preferably, also a compound containing a carbon atom), and the like are removed, so that the impurity concentration in the oxide semiconductor film formed in the film formation chamber can be reduced.

As an example of the film formation conditions, the following conditions can be employed: the distance between the substrate and the target is 100 mm, the pressure is 0.6 Pa, the direct-current (DC) power source is 0.5 kW, and the film formation atmosphere is an oxygen atmosphere (the proportion of the oxygen flow rate is 100%). Note that a pulse direct current power source is preferable because powder substances (also referred to as particles or dust) generated at the time of the film formation can be reduced and the film thickness can be uniform.

Note that before the oxide semiconductor film is formed by a sputtering method, powdery substances (also referred to as particles or dusts) which are attached on a surface of the metal oxide film 204 are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas such as nitrogen, helium, or oxygen may be used.

The oxide semiconductor film can be processed by being etched after a mask having a desired shape is formed over the oxide semiconductor film. The mask may be formed by a method such as photolithography or an ink-jet method. The metal oxide film 204 and the like are also processed while the oxide semiconductor film is processed. Thus, the transistor 110 in FIG. 4D can be manufactured.

Note that the etching of the oxide semiconductor film may be performed by dry etching, wet etching, or both wet etching and dry etching in combination.

After that, heat treatment (first heat treatment) is preferably performed on the oxide semiconductor film. Excessive hydrogen (including water and hydroxyl) in the oxide semiconductor film is removed by the first heat treatment and a structure of the oxide semiconductor film is improved, so that defect levels in an energy gap of the oxide semiconductor film can be reduced. The temperature of the first heat treatment is higher than or equal to 250° C. and lower than or equal to 650° C., preferably higher than or equal to 450° C. and lower than or equal to 600° C. or lower than the strain point of the substrate.

Further, excessive hydrogen (including water or hydroxyl) contained in the metal oxide film 204 can also be removed by the first heat treatment.

The heat treatment can be performed in such a manner that, for example, an object to be processed is introduced into an electric furnace in which a resistance heating element or the like is used and heated at 450° C. under a nitrogen atmosphere for 1 hour. During the heat treatment, the oxide semiconductor film is not exposed to the air to prevent the entry of water and hydrogen.

The heat treatment apparatus is not limited to the electric furnace and may be an apparatus for heating an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon, is used.

For example, as the first heat treatment, a GRTA process may be performed as follows. The object to be processed is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas including oxygen during the process. This is because defect levels in energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the impurity concentration is 1 ppm or less, preferably 0.1 ppm or less).

In any case, impurities are reduced by the first heat treatment so that the i-type (intrinsic) or substantially i-type oxide semiconductor film is obtained. Accordingly, a transistor having extremely excellent characteristics can be realized.

The above heat treatment (first heat treatment) can be referred to as dehydration treatment, dehydrogenation treatment, or the like because of its effect of removing hydrogen, water, and the like. The dehydration treatment or dehydrogenation treatment can be performed at timing, for example, after the oxide semiconductor film is processed to have an island shape. Such dehydration treatment or dehydrogenation treatment may be performed once or plural times.

Note that the case is described here in which after the oxide semiconductor film is processed to have an island shape, the first heat treatment is performed; however, one embodiment of the invention disclosed herein is not construed as being limited thereto. The oxide semiconductor film may be processed after the first heat treatment.

Figure 4C:
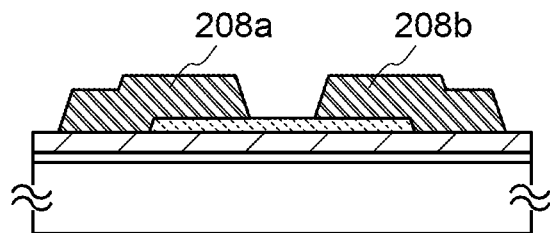

Next, a conductive film for forming the source electrode and the drain electrode (including a wiring formed in the same layer as the source electrode and the drain electrode) is formed over the metal oxide film 204 and the oxide semiconductor film 206 and processed to form the source electrode 208a and the drain electrode 208b (see FIG. 4C). The channel length L of the transistor depends on the distance between the edges of the source electrode 208a and the drain electrode 208b which are formed here.

As the conductive film used for the source electrode 208a and the drain electrode 208b, for example, a metal film containing an element selected from Al, Cr, Cu, Ta, Ti, Mo, and W or a metal nitride film containing any of the above elements as its main component (a titanium nitride film, a molybdenum nitride film, or a tungsten nitride film) can be used. A metal film having a high melting point of Ti, Mo, W, or the like or a metal nitride film of any of these elements (a titanium nitride film, a molybdenum nitride film, or a tungsten nitride film) may be stacked on one of or both a lower side and an upper side of the metal film of Al, Cu, or the like.

Alternatively, the conductive film used for the source electrode 208a and the drain electrode 208b may be formed using a conductive metal oxide. As the conductive metal oxide, indium oxide ($In_2O_3$ or the like), tin oxide ($SnO_2$ or the like), zinc oxide (ZnO or the like), indium oxide-tin oxide alloy ($In_2O_3$—$SnO_2$ or the like, which is abbreviated to ITO), indium oxide-zinc oxide alloy ($In_2O_3$—ZnO or the like), or any of these metal oxide materials in which silicon oxide is contained can be used.

The conductive film can be processed by etching using a resist mask. Ultraviolet, a KrF laser light, an ArF laser light, or the like is preferably used for light exposure for forming a resist mask for the etching.

In the case where a channel length L is less than 25 nm, light exposure for forming the resist mask is preferably performed using extreme ultraviolet light having an extremely short wavelength of several nanometers to several tens of nanometers, for example. In the light exposure by extreme ultraviolet light, the resolution is high and the focus depth is large. Thus, the channel length L of the transistor formed later can be reduced, whereby the operation speed of a circuit can be increased.

Alternatively, the etching step may be performed using a resist mask formed by a so-called multi-tone mask. A resist mask formed by a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using a multi-tone mask. Thus, simplification of the manufacturing process can be realized.

In some cases, only part of the oxide semiconductor film 206 is etched to be an oxide semiconductor film having a groove portion (a recessed portion) when the conductive film is etched.

After that, water or the like adsorbed onto a surface of an exposed portion of the oxide semiconductor film may be removed by plasma treatment using a gas such as $N_2O$, $N_2$, or Ar.

Figure 4D:
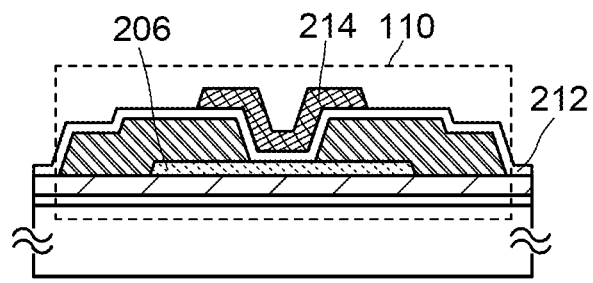

Then, the gate insulating film 212 is formed so as to cover the source electrode 208a and the drain electrode 208b and to be in contact with part of the oxide semiconductor film 206 (see FIG. 4D).

Note that the gate insulating film 212 is similar to the insulating film 202. Note that a material having a high dielectric constant, such as a hafnium oxide, may be used for the gate insulating film 212 considering the function of the gate insulating film of the transistor.

After the gate insulating film 212 is formed, second heat treatment is preferably performed. The temperature of the second heat treatment is higher than or equal to 250° C. and lower than or equal to 700° C., preferably higher than or equal to 450° C. and lower than or equal to 600° C. or lower than the strain point of the substrate. Note that the timing of the second heat treatment is not particularly limited. For example, the second heat treatment may be performed after the gate electrode 214 is formed. Alternatively, the second heat treatment may be performed following the first heat treatment, the first heat treatment may also serve as the second heat treatment, or the second heat treatment may also serve as the first heat treatment.

The second heat treatment may be performed under an atmosphere of nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, or the like be not contained in the atmosphere of nitrogen, oxygen, ultra-dry air, or a rare gas. The purity of nitrogen, oxygen, or a rare gas introduced into a heat treatment apparatus is preferably greater than or equal to 6 N (99.9999%), more preferably greater than or equal to 7 N (99.99999%) (i.e., the impurity concentration is 1 ppm or less, preferably 0.1 ppm or less).

In addition, impurities in the metal oxide film 204 are removed at the same time by this heat treatment, and the metal oxide film 204 can be highly purified.

As described above, the oxide semiconductor film 206 can be highly purified by applying at least one of the first heat treatment and the second heat treatment so that impurities contained therein other than main components of the oxide semiconductor film 206 is contained as little as possible. The highly purified oxide semiconductor film 206 20 includes extremely few carriers (close to zero) derived from a donor, and the carrier concentration is less than $1\times10^{14}/cm^3$, preferably less than $1\times10^{12}/cm^3$, or more preferably less than $1\times10^{11}/cm^3$.

After that, the gate electrode 214 is formed (see FIG. 4D). The gate electrode 214 can be formed using a metal material such as molybdenum, titanium, tantalum, tungsten, aluminum, copper, neodymium, or scandium, or an alloy material containing any of these metal materials as its main component. The gate electrode 214 may have either a single-layer structure or a stacked-layer structure.

Through the above process, the transistor 110 is formed (see FIG. 4D).

<Manufacturing Process of Transistor 120>

An example of a manufacturing process of the transistor 120 in FIG. 3A will be described with reference to FIGS. 5A to 5D.

Figure 5A:
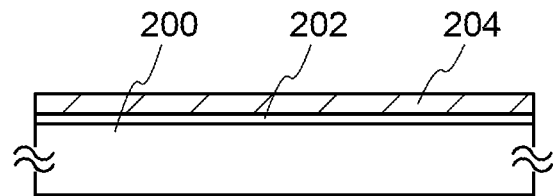
FIGS. 5A to 5D are cross-sectional views of an example of a manufacturing process of a semiconductor device.

First, the insulating film 202 is formed over the substrate 200, and then, the metal oxide film 204 is formed over and in contact with the insulating film 202 (see FIG. 5A). The description on the manufacturing process of the transistor 110 can be referred to for the details.

Figure 5B:
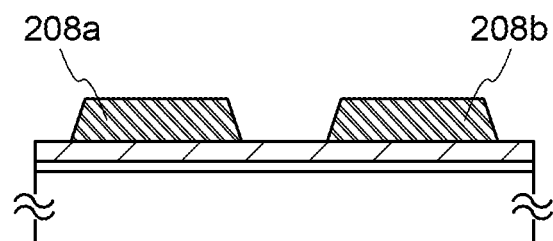
Figure 5C:
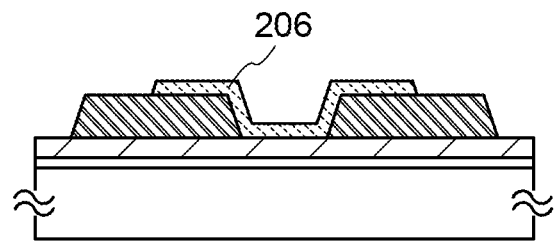
Figure 5D:
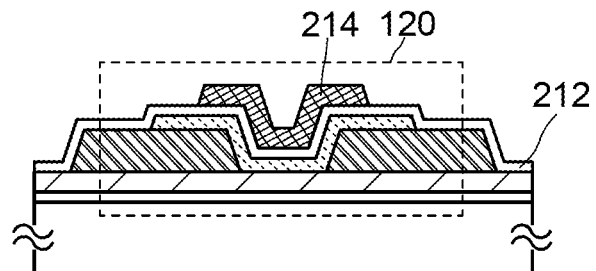

Next, a conductive film for forming the source electrode and the drain electrode (including a wiring formed in the same layer as the source electrode and the drain electrode) is formed over the metal oxide film 204 and processed to form the source electrode 208a and the drain electrode 208b (see FIG. 5B). The description on the manufacturing process of the transistor 110 can be referred to for the details.

Next, an oxide semiconductor film is formed over the metal oxide film 204 so as to be connected to the source electrode 208a and the drain electrode 208b and then is processed to form the oxide semiconductor film 206 having an island shape (see FIG. 4C). The description on the manufacturing process of the transistor 110 can be referred to for the details.

Next, the gate insulating film 212 is formed so as to cover the source electrode 208a and the drain electrode 208b and to be in contact with part of the oxide semiconductor film 206. Then, the gate electrode 214 is formed (see FIG. 4D). The description on the manufacturing process of the transistor 110 can be referred to for the details of the gate insulating film 212 and the gate electrode 214.

Through the above process, the transistor 120 is formed (see FIG. 4D).

In the transistor according to this embodiment, the bottom surface portion of the oxide semiconductor film is provided with the metal oxide film containing a constituent similar to that of the oxide semiconductor film, and an insulating film containing a different constituent from the metal oxide film and the oxide semiconductor film is formed in contact with a surface of the metal oxide film, which is opposite to the surface in contact with the oxide semiconductor film. Thus, the metal oxide film containing a material compatible with the oxide semiconductor film is provided in contact with the oxide semiconductor film, which suppresses trapping of charge or the like which can be generated due to the operation of a semiconductor device at the interface between the oxide semiconductor film and the metal oxide film. Meanwhile, an insulator containing a material with which a charge trapping center can be formed at the interface is provided in contact with the metal oxide film, whereby the charge can be trapped at the interface between the metal oxide film and the insulator. Consequently, the oxide semiconductor film can be less adversely affected by charge, which suppresses fluctuation in the threshold voltage of the transistor due to trapping of charge at the interface of the oxide semiconductor film.

The oxide semiconductor film used for the active layer of the transistor is an oxide semiconductor film highly purified to be electrically i-type (intrinsic) through heat treatment in which impurities such as hydrogen, moisture, hydroxyl, and hydride (also referred to as a hydrogen compound) are removed from the oxide semiconductor and oxygen which is one of main component materials of the oxide semiconductor is supplied and is also reduced in a step of removing impurities. The transistor including the oxide semiconductor film highly purified in such a manner has electric characteristics which are less likely to change, and thus is electrically stable.

When charge is trapped at the interface of the oxide semiconductor film, the threshold voltage of the transistor shifts (for example, when positive charge is trapped to the back channel side, the threshold voltage of the transistor shifts in a negative direction). As one of factors of such charge trapping, the model where cations (or atoms which are sources of the cations) travel and are trapped can be given, for example. In the transistor including an oxide semiconductor, such cation sources may be hydrogen atoms. In the invention disclosed herein, the highly purified oxide semiconductor is used and is in contact with the stack of the metal oxide film and the insulating film, so that it is possible to suppress even charge trapping due to hydrogen, which may be caused in the above model. The above model is supposed to be realized when the ionization rate of hydrogen is, for example, about 10%.

As described above, a semiconductor device including an oxide semiconductor having stable electric characteristics can be provided. Therefore, a highly reliable semiconductor device can be provided.

The structures, methods, and the like described in this embodiment can be combined as appropriate with any of the structures, methods, and the like described in the other embodiments.

Embodiment 2

A semiconductor device (also referred to as a display device) with a display function can be manufactured using the transistor an example of which is described in Embodiment 1. Further, part or whole of a driver circuit including the transistor can be formed over the same substrate as a pixel portion, whereby a system-on-panel can be obtained.

Figure 6A:
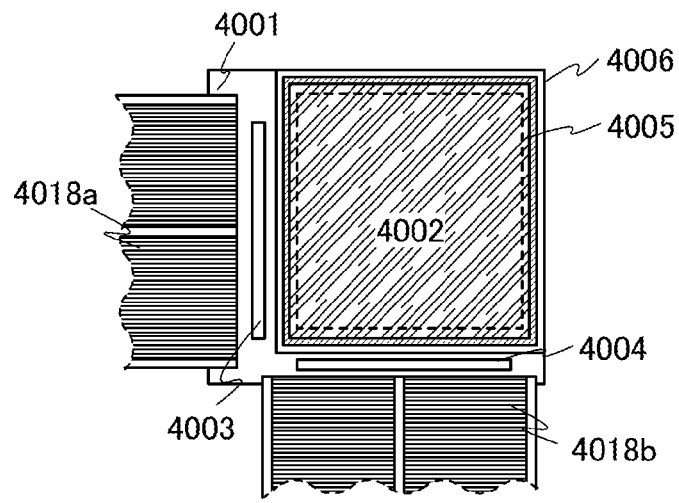
FIGS. 6A to 6C each illustrate one embodiment of a semiconductor device.

In FIG. 6A, a sealant 4005 is provided so as to surround a pixel portion 4002 provided over a first substrate 4001, and the pixel portion 4002 is sealed between the first substrate 4001 and a second substrate 4006. In FIG. 6A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potential are supplied to the signal line driver circuit 4003 and the scan line driver circuit 4004, each of which is separately formed, and the pixel portion 4002 from flexible printed circuits (FPCs) 4018a and 4018b.

Figure 6B:
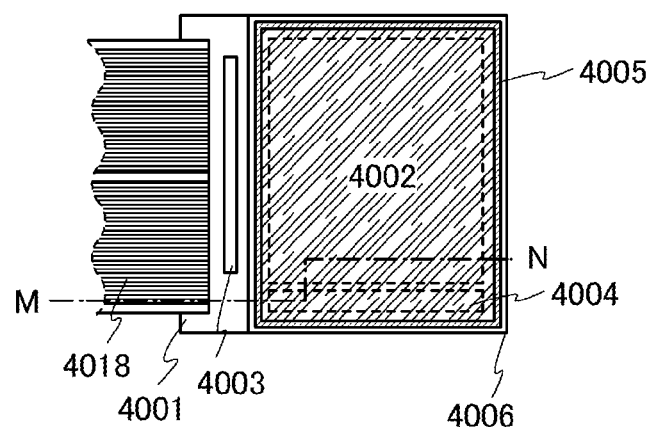
Figure 6C:
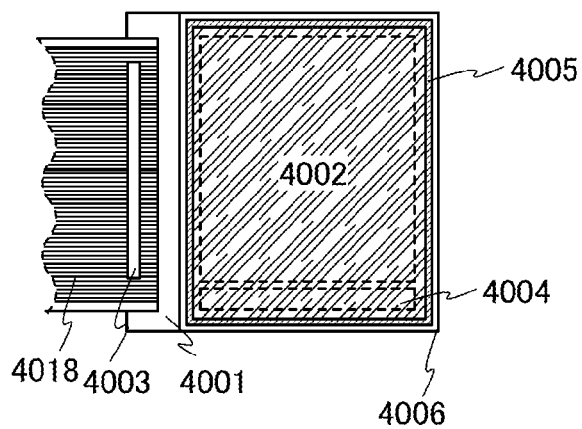

In FIGS. 6B and 6C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 as well as a display element are sealed by the first substrate 4001, the sealant 4005, and the second substrate 4006. In FIGS. 6B and 6C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 6B and 6C, various signals and potential are supplied to the signal line driver circuit 4003 which is separately formed, the scan line driver circuit 4004, and the pixel portion 4002 from an FPC 4018.

Although FIGS. 6B and 6C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 6A illustrates an example in which the signal line driver circuit 4003 and the scan line driver circuit 4004 are mounted by a COG method. FIG. 6B illustrates an example in which the signal line driver circuit 4003 is mounted by a COG method. FIG. 6C illustrates an example in which the signal line driver circuit 4003 is mounted by a TAB method.

The display device includes a panel in which the display element is sealed, and a module in which an IC or the like including a controller is mounted on the panel.

Note that a display device in this specification refers to an image display device, a display device, or a light source (including a lighting device). Further, the display device includes the following modules in its category: a module to which a connector such as an FPC, a TAB tape, or a TCP is attached; a module having a TAB tape or a TCP which is provided with a printed wiring board at the end thereof; and a module having an integrated circuit (IC) which is directly mounted on a display element by a COG method.

Each of the pixel portion and the scan line driver circuit which are provided over the first substrate includes a plurality of transistors. The transistor an example of which is described in Embodiment 1 or 2 can be used as the transistor.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 7:
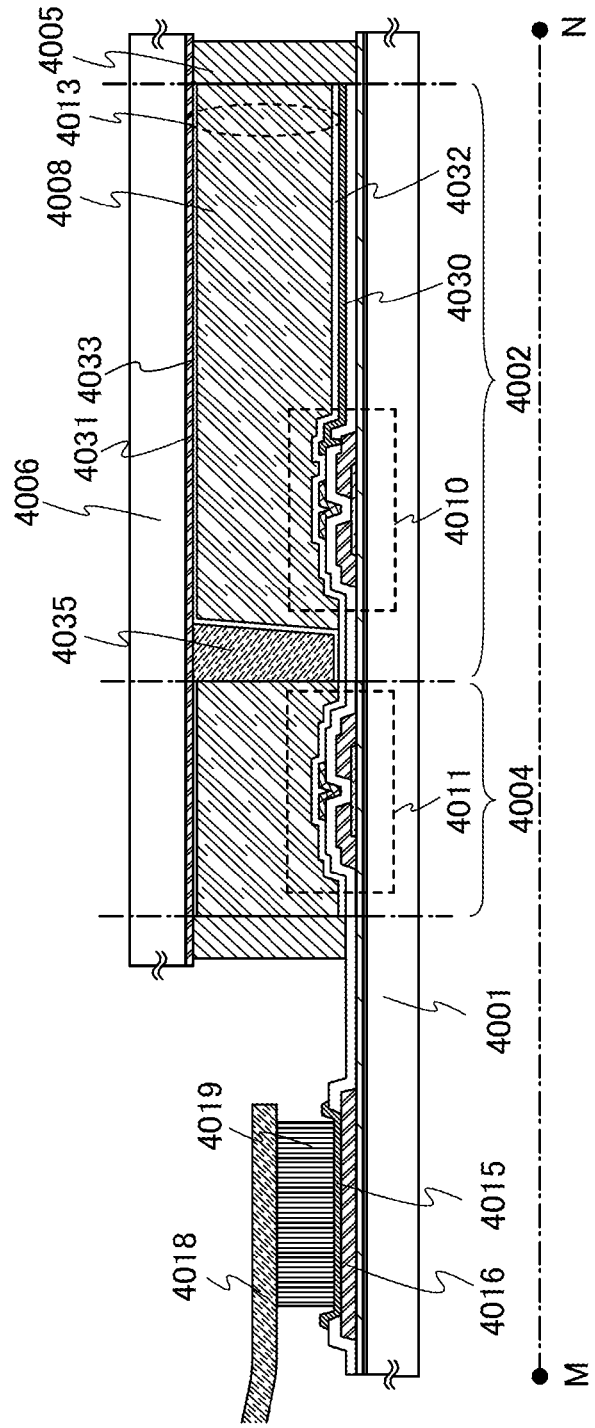
FIG. 7 illustrates one embodiment of a semiconductor device.
Figure 8:
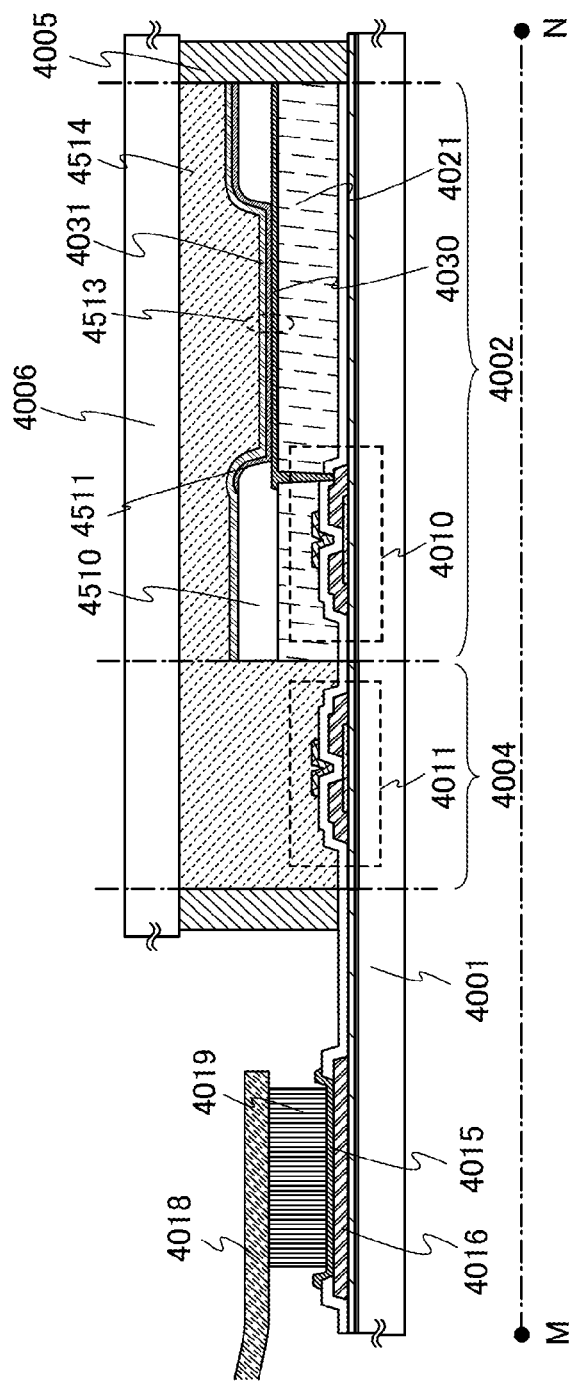
FIG. 8 illustrates one embodiment of a semiconductor device.
Figure 9:
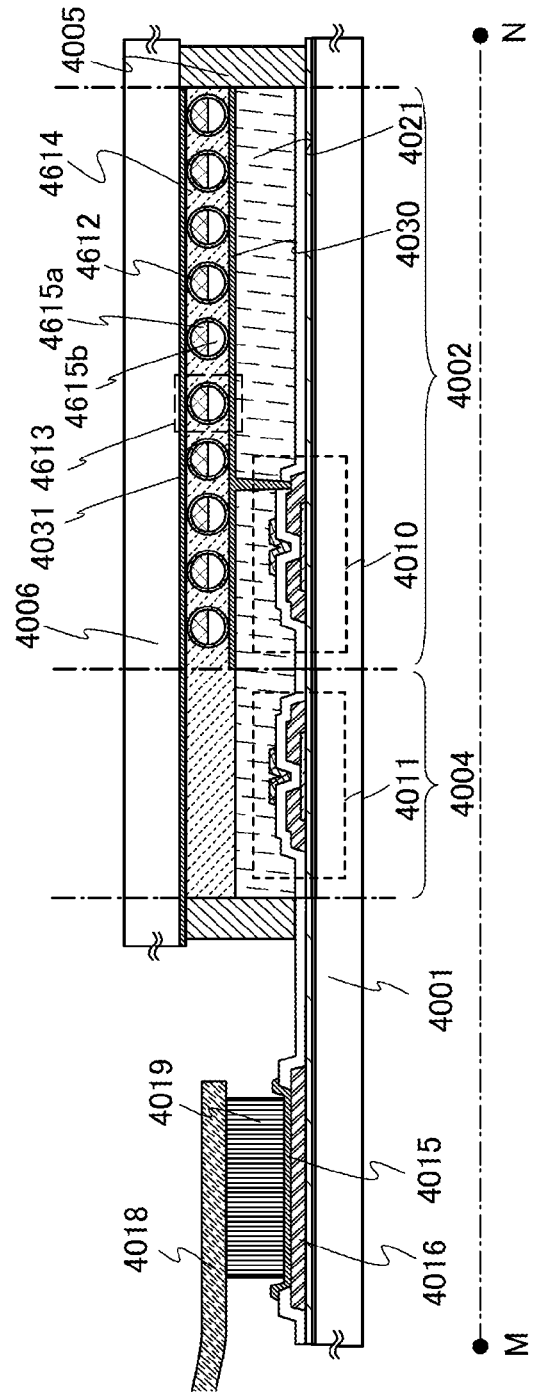
FIG. 9 illustrates one embodiment of a semiconductor device.

One embodiment of the semiconductor device is described with reference to FIG. 7, FIG. 8, and FIG. 9. FIG. 7, FIG. 8, and FIG. 9 correspond to cross-sectional views taken along line M-N in FIG. 6B.

As illustrated in FIG. 7, FIG. 8, and FIG. 9, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030. The terminal electrode 4016 is formed using the same conductive film as a source electrode and a drain electrode of a transistor 4010 and a transistor 4011.

Each of the pixel portion 4002 and the scan line driver circuit 4004 provided over the first substrate 4001 includes a plurality of transistors. In FIG. 7, FIG. 8, and FIG. 9, an example of the transistor 4010 included in the pixel portion 4002 and the transistor 4011 included in the scan line driver circuit 4004 are described.

In this embodiment, any of the transistors described in Embodiment 1 can be used as the transistor 4010 and the transistor 4011. Variation in the electric characteristics of the transistor 4010 and the transistor 4011 is suppressed and the transistor 4010 and the transistor 4011 are electrically stable. Therefore, a highly reliable semiconductor device can be provided as the semiconductor devices illustrated in FIG. 7, FIG. 8, and FIG. 9.

The transistor 4010 included in the pixel portion 4002 is electrically connected to a display element to form a display panel. A variety of display elements can be used as the display element as long as display can be performed.

An example of a liquid crystal display device using a liquid crystal element for a display element is described in FIG. 7. In FIG. 7, a liquid crystal element 4013 which is a display element includes the first electrode layer 4030, a second electrode layer 4031, and a liquid crystal layer 4008. An insulating film 4032 and an insulating film 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

Reference numeral 4035 indicates a columnar spacer formed by selectively etching an insulating film. The columnar spacer 4035 is provided in order to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition containing a chiral material at higher than or equal to 5 wt. % can be used in order to improve the temperature range. The liquid crystal composition containing a liquid crystal exhibiting a blue phase and a chiral agent has a short response time of shorter than or equal to 1 msec, has optical isotropy, which makes an alignment process unneeded, and has a small viewing angle dependence. In addition, since an alignment film does not need to be provided and thus rubbing treatment is unnecessary, electrostatic discharge damage caused by rubbing treatment can be prevented and defects and damage of a liquid crystal display device can be reduced in the manufacturing process. Thus, productivity of the liquid crystal display device can be increased.

The specific resistivity of the liquid crystal material is higher than or equal to $1\times10^9$ Ω·cm, preferably higher than or equal to $1\times10^{11}$ Ω·cm, or more preferably higher than or equal to $1\times10^{12}$ Ω·cm. Note that the specific resistivity in this specification is measured at 20° C.

The size of storage capacitor formed in the liquid crystal display device is set considering the leakage current of the transistor provided in the pixel portion, or the like so that charge can be held for a predetermined period. By using a transistor including a highly purified oxide semiconductor film, it is enough to provide a storage capacitor having a capacitance that is less than or equal to $1/3$, preferably less than or equal to $1/5$ of a liquid crystal capacitance of each pixel.

In the transistor including a highly purified oxide semiconductor film, which is used in this embodiment, the current in an off state (the off-state current) can be made small. Accordingly, an electrical signal such as an image signal can be held for a longer period, and a writing interval can be set longer when the power is on. Consequently, frequency of refresh operation can be reduced, which leads to an effect of suppressing power consumption.

The field-effect mobility of the transistor including a highly purified oxide semiconductor film used in this embodiment can be relatively high, whereby high-speed driving is possible. Therefore, by using the transistor in a pixel portion of a liquid crystal display device, a high-quality image can be provided. Since the above transistors can be separately formed over one substrate in a driver circuit portion and a pixel portion, the number of components can be reduced in the liquid crystal display device.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

In addition, the liquid crystal display device may be a normally black liquid crystal display device such as a transmissive liquid crystal display device utilizing a vertical alignment (VA) mode. Here, the vertical alignment mode is one of methods of controlling alignment of liquid crystal molecules of a liquid crystal display panel. Some examples are given as the vertical alignment mode; for example, a multi-domain vertical alignment (MVA) mode, a patterned vertical alignment (PVA) mode, an ASV mode, or the like can be employed. Moreover, it is possible to use a method called domain multiplication or multi-domain design, in which a pixel is divided into some regions (subpixels) and molecules are aligned in different directions in their respective regions.

Further, in the display device, a black matrix (a light-blocking layer), an optical member (an optical substrate) such as a polarizing member, a retardation member, or an anti-reflection member, and the like are provided as appropriate. For example, circular polarization obtained by using a polarizing substrate and a retardation substrate may be used. In addition, a backlight, a side light, or the like may be used as a light source.

In addition, with the use of a plurality of light-emitting diodes (LEDs) as a backlight, a time-division display method (a field-sequential driving method) can be employed. With the field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different depending on dots of color elements. The present invention is not limited to a display device for color display but can also be applied to a display device for monochrome display.

In addition, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

As for the organic EL element, by application of voltage to a light-emitting element, electrons and holes are separately injected from a pair of electrodes into a layer containing a light-emitting organic compound, and current flows. The carriers (electrons and holes) are recombined; thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that an example of an organic EL element is described here as a light-emitting element.

In order to extract light emitted from the light-emitting element, at least one of a pair of electrodes may be transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element is described in FIG. 8. A light-emitting element 4513 which is a display element is electrically connected to the transistor 4010 provided in the pixel portion 4002. Note that the structure of the light-emitting element 4513 is, but not limited to, a stacked-layer structure which includes the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover material with high air-tightness and little degasification so that the light-emitting device is not exposed to the outside air, in this manner.

As the filler 4514, an ultraviolet curable resin or a thermosetting resin as well as an inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the first and second particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless) from each other.

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

Further, as the electronic paper, a display device using a twisting ball display method can be used. The twisting ball display method refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 9 illustrates an active matrix electronic paper as one embodiment of a semiconductor device. The electronic paper in FIG. 9 is an example of a display device using a twisting ball display method. The twist ball display method refers to a method in which spherical particles each colored in black and white are arranged between electrode layers used for a display element, and a potential difference is generated between the electrode layers to control orientation of the spherical particles, so that display is performed.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 7, FIG. 8, and FIG. 9, a flexible substrate as well as a glass substrate can be used as the first substrate 4001 and the second substrate 4006. For example, a plastic substrate having light-transmitting properties can be used. For plastic, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can also be used.

An insulating layer 4021 can be formed using an inorganic insulating material or an organic insulating material. An organic material having heat resistance such as an acrylic resin, polyimide, a benzocyclobutene resin, polyamide, or an epoxy resin is preferably used as a planarizing insulating film. Other than such organic insulating materials, it is also possible to use a low-dielectric constant material (a low-k material), a siloxane-based resin, phosphosilicate glass (PSG), borophosphosilicate glass (BPSG), or the like. Note that the insulating layer may be formed by stacking a plurality of insulating films formed with these materials.

There is no particular limitation on the method for forming the insulating layer 4021, and the insulating layer 4021 can be formed, depending on the material, by a sputtering method, a spin coating method, a dipping method, spray coating, a droplet discharging method (e.g., an ink-jet method, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (also referred to as the pixel electrode layer, the common electrode layer, the counter electrode layer, or the like) for applying voltage to the display element may have light-transmitting properties or light-reflecting properties, depending on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter also referred to as ITO), indium zinc oxide, or indium tin oxide to which silicon oxide is added.

The first electrode layer 4030 and the second electrode layer 4031 can each be formed using one kind or plural kinds of materials selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as a conductive polymer) can be used for the first electrode layer 4030 and the second electrode layer 4031. As the conductive high molecule, a so-called t-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protection circuit is preferably formed using a nonlinear element.

As described above, by using any of the transistors examples of which are described in Embodiment 1, a highly reliable semiconductor device can be provided. Note that the transistors examples of which are described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The structures, methods, and the like described in this embodiment can be combined as appropriate with any of the structures, methods, and the like described in the other embodiments.

Embodiment 3

A semiconductor device disclosed in this specification can be applied to a variety of electronic devices (including an amusement machine). Examples of the electronic device include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, and a large-sized game machine such as a pachinko machine. Examples of electronic devices each including the semiconductor device described in the above embodiment are described.

Figure 10A:
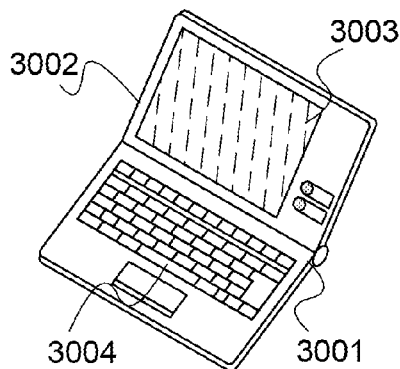
FIGS. 10A to 10F each illustrate an electronic device.

FIG. 10A illustrates a laptop personal computer, which includes a main body 3001, a housing 3002, a display portion 3003, a keyboard 3004, and the like. The semiconductor device described in Embodiment 1 or 2 is applied, whereby the highly reliable laptop personal computer can be provided.

Figure 10B:
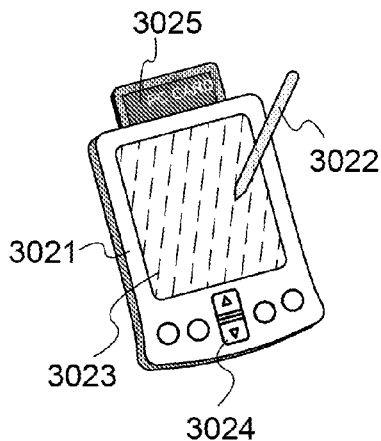

FIG. 10B is a portable information terminal (PDA), which includes a display portion 3023, an external interface 3025, an operation button 3024, and the like in a main body 3021. A stylus 3022 is included as an accessory for operation. The semiconductor device described in Embodiment 1 or 2 is applied, whereby the highly reliable personal digital assistant (PDA) can be provided.

Figure 10C:
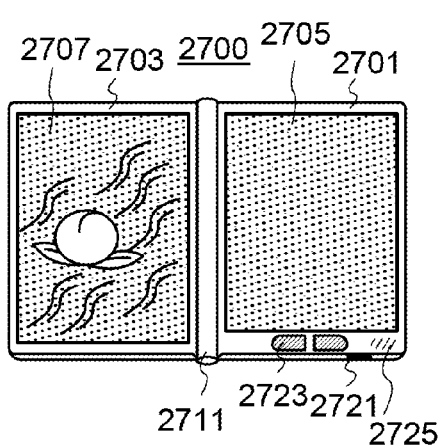

FIG. 10C illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 10C) and images can be displayed on a display portion on the left side (the display portion 2707 in FIG. 10C). The semiconductor device described in Embodiment 1 or 2 is applied, whereby the highly reliable e-book reader 2700 can be provided.

An example in which the housing 2701 is provided with an operation portion and the like is described in FIG. 10C. For example, the housing 2701 is provided with a power switch 2721, operation keys 2723, a speaker 2725, and the like. With the operation keys 2723, pages can be turned. Note that a keyboard, a pointing device, or the like may also be provided on the same surface as the display portion of the housing. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

Further, the e-book reader 2700 may send and receive information wirelessly. Through wireless communication, desired book data or the like can be purchased and downloaded from an e-book server.

Figure 10D:
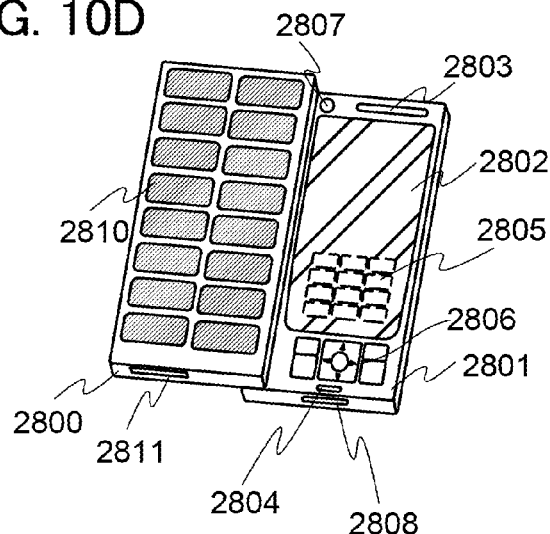

FIG. 10D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. The semiconductor device described in Embodiment 1 or 2 is applied, whereby the highly reliable mobile phone can be provided.

Further, the display panel 2802 is provided with a touch panel. A plurality of operation keys 2805 which is displayed as images is illustrated by dashed lines in FIG. 10D. Note that the mobile phone includes a boosting circuit for raising a voltage outputted from the solar cell 2810 to a voltage necessary for each circuit.

In the display panel 2802, the display direction can be changed as appropriate depending on a usage pattern. Further, the mobile phone is provided with the camera lens 2807 on the same surface as the display panel 2802; thus, it can be used as a video phone. The speaker 2803 and the microphone 2804 can be used for videophone calls, recording and playing sound, and the like as well as voice calls. Moreover, the housing 2800 and the housing 2801 in a state where they are opened as illustrated in FIG. 10D can be slid so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided.

Figure 10E:
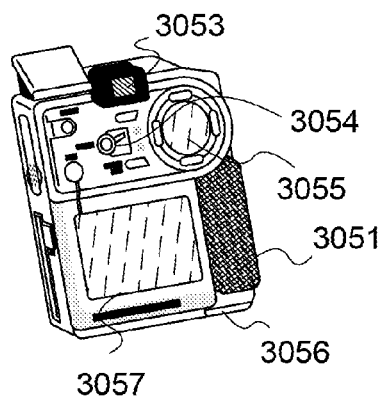

FIG. 10E illustrates a digital video camera, which includes a main body 3051, a display portion A 3057, an eyepiece 3053, an operation switch 3054, a display portion B 3055, a battery 3056, and the like. The semiconductor device described in Embodiment 1 or 2 is applied, whereby the highly reliable digital video camera can be provided.

Figure 10F:
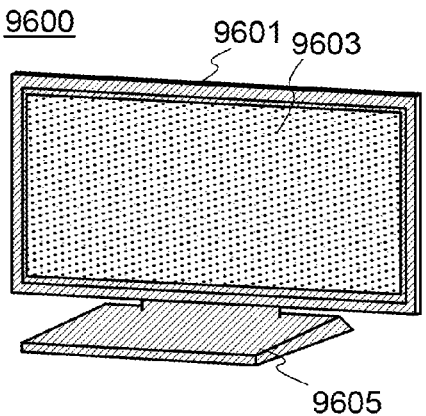

FIG. 10F illustrates an example of a television set. In a television set 9600, a display portion 9603 is incorporated in a housing 9601. The display portion 9603 can display images. Here, the housing 9601 is supported by a stand 9605. The semiconductor device described in Embodiment 1 or 2 is applied, whereby the highly reliable television set 9600 can be provided.

The television set 9600 can operate by an operation switch of the housing 9601 or a separate remote controller. Further, the remote controller may be provided with a display portion for displaying data outputted from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures, methods, and the like described in this embodiment can be combined as appropriate with any of the structures, methods, and the like described in the other embodiments.

This application is based on Japanese Patent Application serial No. 2010-086449 filed with the Japan Patent Office on Apr. 2, 2010, the entire contents of which are hereby incorporated by reference.

What is claimed is:

1. A semiconductor device comprising:
   a transistor comprising:
      a gate electrode;
      a semiconductor film comprising a channel formation region;
      a source electrode and a drain electrode over the semiconductor film;
      a gate insulating film between the gate electrode and the semiconductor film; and
      a metal oxide film in contact with the semiconductor film,
   wherein the semiconductor film and the gate insulating film are between the gate electrode and the metal oxide film,
   wherein the semiconductor film comprises indium, gallium, zinc, and oxygen,
   wherein the metal oxide film comprises gallium and oxygen, and
   wherein a gallium component in a composition of the metal oxide film is more than a gallium component in a composition of the semiconductor film.

2. The semiconductor device according to claim 1, wherein the gallium component in the composition of the metal oxide film is more than or equal to ⅓ and less than or equal to 1/2.4.

3. The semiconductor device according to claim 1, wherein the metal oxide film comprises an impurity element in a concentration of greater than 0 atomic % and less than or equal to 20 atomic %.

4. The semiconductor device according to claim 3, wherein the impurity element belongs to Group 13 in a periodic table.

5. The semiconductor device according to claim 4, wherein the impurity element is aluminum.

6. The semiconductor device according to claim 1, wherein an energy gap of the metal oxide film is larger than an energy gap of the semiconductor film.

7. The semiconductor device according to claim 1, wherein an energy at a bottom of a conduction band of the metal oxide film is higher than an energy at a bottom of a conduction band of the semiconductor film.

8. The semiconductor device according to claim 1, wherein the semiconductor film and the gate insulating film are in contact with each other.

9. The semiconductor device according to claim 1, wherein the gate insulating film and the metal oxide film are in contact with each other.

10. The semiconductor device according to claim 1, wherein the semiconductor film has a carrier concentration of lower than $1\times10^{14}/cm^3$.

11. A display device comprising:
   a transistor comprising:
      a gate electrode;
      a semiconductor film comprising a channel formation region;
      a source electrode and a drain electrode over the semiconductor film;
      a gate insulating film between the gate electrode and the semiconductor film; and
      a metal oxide film in contact with the semiconductor film; and
   a pixel electrode electrically connected to the transistor,
   wherein the semiconductor film and the gate insulating film are between the gate electrode and the metal oxide film,
   wherein the semiconductor film comprises indium, gallium, zinc, and oxygen,
   wherein the metal oxide film comprises gallium and oxygen, and
   wherein a gallium component in a composition of the metal oxide film is more than a gallium component in a composition of the semiconductor film.

12. The display device according to claim 11, wherein the gallium component in the composition of the metal oxide film is more than or equal to ⅓ and less than or equal to 1/2.4.

13. The display device according to claim 11, wherein the metal oxide film comprises an impurity element in a concentration of greater than 0 atomic % and less than or equal to 20 atomic %.

14. The display device according to claim 13, wherein the impurity element belongs to Group 13 in a periodic table.

15. The display device according to claim 14, wherein the impurity element is aluminum.

16. The display device according to claim 11, wherein an energy gap of the metal oxide film is larger than an energy gap of the semiconductor film.

17. The display device according to claim 11, wherein an energy at a bottom of a conduction band of the metal oxide film is higher than an energy at a bottom of a conduction band of the semiconductor film.

18. The display device according to claim 11, wherein the gate electrode is over the semiconductor film.

19. The display device according to claim 11, wherein the semiconductor film and the gate insulating film are in contact with each other.

20. The display device according to claim 11, wherein the gate insulating film and the metal oxide film are in contact with each other.

21. The display device according to claim 11, wherein the semiconductor film has a carrier concentration of lower than $1 \times 10^{14}/cm^3$.

22. The display device according to claim 11, comprising a liquid crystal layer over the pixel electrode.

23. The display device according to claim 11, comprising an electroluminescent layer over the pixel electrode.

24. A semiconductor device comprising:
a transistor comprising:
a gate electrode;
a semiconductor film comprising a channel formation region;
a source electrode and a drain electrode over the semiconductor film;
a gate insulating film between the gate electrode and the semiconductor film; and
a metal oxide film in contact with the semiconductor film,
wherein the semiconductor film and the gate insulating film are between the gate electrode and the metal oxide film,
wherein the gate electrode is over the semiconductor film,
wherein the semiconductor film comprises indium, gallium, zinc, and oxygen,
wherein the metal oxide film comprises gallium and oxygen, and
wherein a gallium component in a composition of the metal oxide film is more than a gallium component in a composition of the semiconductor film.

25. The semiconductor device according to claim 24, wherein the gallium component in the composition of the metal oxide film is more than or equal to ⅓ and less than or equal to 1/2.4.

26. The semiconductor device according to claim 24, wherein the metal oxide film comprises an impurity element in a concentration of greater than 0 atomic % and less than or equal to 20 atomic %.

27. The semiconductor device according to claim 26, wherein the impurity element belongs to Group 13 a periodic table.

28. The semiconductor device according to claim 27, wherein the impurity element is aluminum.

29. The semiconductor device according to claim 24, wherein an energy gap of the metal oxide film is larger than an energy gap of the semiconductor film.

30. The semiconductor device according to claim 24, wherein an energy at a bottom of a conduction band of the metal oxide film is higher than an energy at a bottom of a conduction band of the semiconductor film.

31. The semiconductor device according to claim 24, wherein the semiconductor film and the gate insulating film are in contact with each other.

32. The semiconductor device according to claim 24, wherein the gate insulating film and the metal oxide film are in contact with each other.

33. The semiconductor device according to claim 24, wherein the semiconductor film has a carrier concentration of lower than $1 \times 10^{14}/cm^3$.

* * * * *